US011313028B2

(12) United States Patent
Schier et al.

(10) Patent No.: US 11,313,028 B2
(45) Date of Patent: Apr. 26, 2022

(54) WEAR RESISTANT PVD TOOL COATING CONTAINING TIALN NANOLAYER FILMS

(71) Applicant: WALTER AG, Tubingen (DE)

(72) Inventors: Veit Schier, Echterdingen (DE); Wolfgang Engelhart, Metzingen (DE)

(73) Assignee: Walter AG, Tubingen (DE)

( * ) Notice: Subject to any disclaimer, the term of this patent is extended or adjusted under 35 U.S.C. 154(b) by 15 days.

(21) Appl. No.: 16/643,253

(22) PCT Filed: Aug. 31, 2018

(86) PCT No.: PCT/EP2018/073490
§ 371 (c)(1),
(2) Date: Feb. 28, 2020

(87) PCT Pub. No.: WO2019/043167
PCT Pub. Date: Mar. 7, 2019

(65) Prior Publication Data
US 2020/0255931 A1    Aug. 13, 2020

(30) Foreign Application Priority Data

Aug. 31, 2017  (EP) .................................. 17188809

(51) Int. Cl.
*C23C 14/06*  (2006.01)
*B23C 5/00*   (2006.01)
(Continued)

(52) U.S. Cl.
CPC .......... *C23C 14/0641* (2013.01); *B23C 5/006* (2013.01); *C23C 14/325* (2013.01);
(Continued)

(58) Field of Classification Search
CPC . B23B 27/148; C23C 14/0641; C23C 28/044; C23C 28/42
(Continued)

(56) References Cited

U.S. PATENT DOCUMENTS 7,901,796 B2*  3/2011  Fukui ..................... B23P 15/28
                                                    428/697
2010/0260561 A1  10/2010  Moriguchi et al.
(Continued)

FOREIGN PATENT DOCUMENTS

DE    102014109942 A1    3/2015
EP       2634285 A1      9/2013
(Continued)

OTHER PUBLICATIONS

Sprute T et al: "Influence of substrate pre-treatments on residual stresses and tribo-mechanical properties of TiAlN-based PVD coatings", Surface and Coatings Technology, vol. 260, Dec. 15, 2014, pp. 369-379.

*Primary Examiner* — Archene A Turner
(74) *Attorney, Agent, or Firm* — Corinne R. Gorski

(57) ABSTRACT

A coated cutting tool and a process for the production thereof is provided. The coated cutting tool includes a substrate and a hard material coating, the substrate being selected from cemented carbide, cermet, ceramics, cubic boron nitride, polycrystalline diamond or high-speed steel. The hard material coating includes a (Ti,Al)N layer stack of alternately stacked (Ti,Al)N sub-layers. The layer stack has an overall atomic ratio of Ti:Al within the (Ti,Al)N layer stack within the range from 0.33:0.67 to 0.67:0.33, a total thickness of the (Ti,Al)N layer stack within the range from 1 µm to 20 µm, each of the individual (Ti,Al)N sub-layers within the (Ti,Al)N layer stack of alternately stacked (Ti, Al)N sub-layers having a thickness within the range from 0.5 nm to 50 nm, each of the individual (Ti,Al)N sub-layers within the (Ti,Al)N layer stack of alternately stacked (Ti, Al)N sub-layers being different in respect of the atomic ratio Ti:Al than an immediately adjacent (Ti,Al)N sub-layer, and other characteristics.

17 Claims, 1 Drawing Sheet

(51) Int. Cl.
*C23C 14/32* (2006.01)
*C23C 14/35* (2006.01)
*C23C 28/04* (2006.01)

(52) U.S. Cl.
CPC ............ *C23C 14/35* (2013.01); *C23C 28/044* (2013.01); *C23C 28/048* (2013.01)

(58) Field of Classification Search
USPC ......................... 428/216, 336, 697, 698, 699
See application file for complete search history.

(56) References Cited

U.S. PATENT DOCUMENTS

| | | |
|---|---|---|
| 2014/0377023 A1 | 12/2014 | Bohlmark et al. |
| 2015/0024183 A1* | 1/2015 | Ericsson ................. C23C 14/22 428/215 |
| 2015/0050490 A1 | 2/2015 | Kumar et al. |
| 2015/0211105 A1 | 7/2015 | Schier et al. |
| 2018/0236563 A1* | 8/2018 | Hirano .................. C23C 14/325 |
| 2018/0281077 A1* | 10/2018 | Tanaka .................. C23C 28/044 |

FOREIGN PATENT DOCUMENTS

| | | | |
|---|---|---|---|
| JP | 2011-212786 | * | 10/2011 |
| WO | 2006/041367 A1 | | 4/2006 |
| WO | 2014/019897 A1 | | 2/2014 |

* cited by examiner

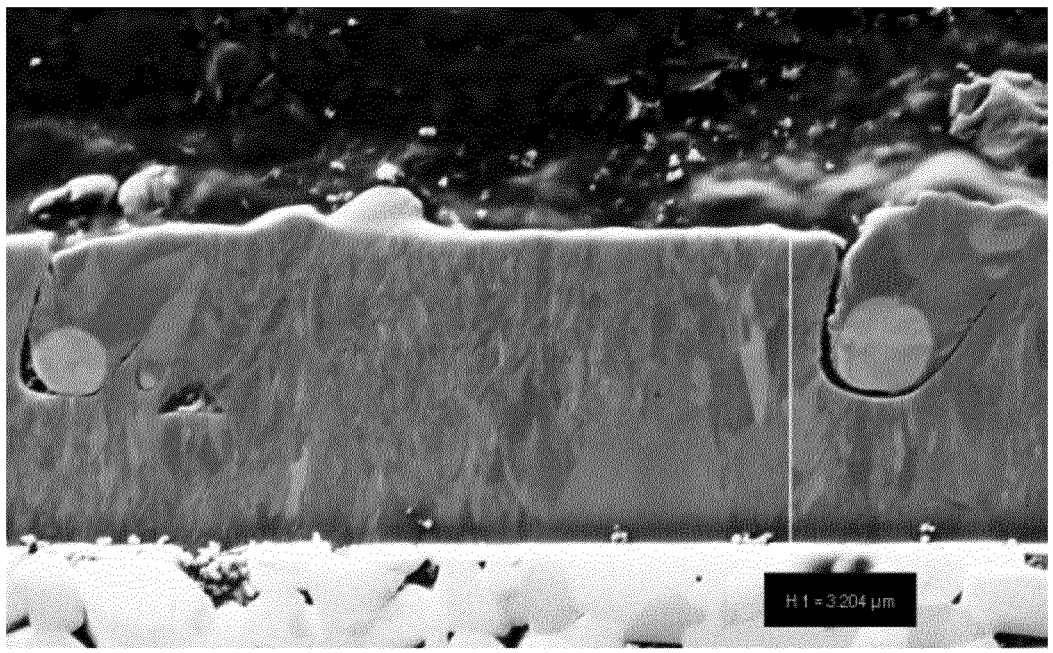
(A)
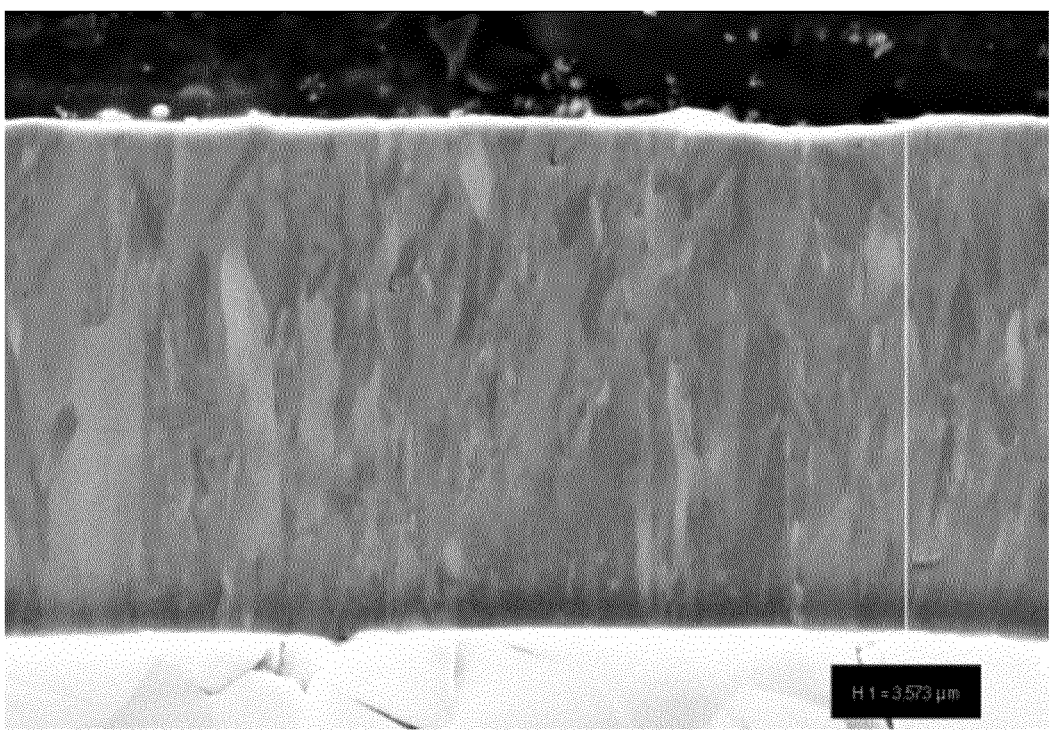
(B)

WEAR RESISTANT PVD TOOL COATING CONTAINING TIALN NANOLAYER FILMS

RELATED APPLICATION DATA

This application is a § 371 National Stage Application of PCT International Application No. PCT/EP2018/073490 filed Aug. 31, 2018 claiming priority to EP 17188809.2 filed Aug. 31, 2017.

FIELD OF THE INVENTION

The present invention refers to a metal cutting tool comprising a substrate of cemented carbide, cermet, ceramic, steel or high-speed steel, and a multi-layer wear protection coating applied to the substrate. The invention further relates to a use of the metal cutting tool as well as a process for the production of such a tool.

BACKGROUND OF THE INVENTION

Cutting tools, such as those used for example for metal cutting, generally consist of a substrate (base body) made of cemented carbide (hard metal), cermet, steel or high-speed steel having a wear-resistant single-layer or multi-layer coating of metallic hard material layers deposited thereon by means of a CVD process (chemical vapor deposition) or a PVD process (physical vapor deposition). There exist various different PVD processes requiring different equipment and resulting in different coating properties, such as for example cathode sputtering, cathodic vacuum arc evaporation (Arc-PVD), ion plating, electron beam evaporation and laser ablation. Cathode sputtering such as magnetron sputtering, reactive magnetron sputtering and high power impulse magnetron sputtering (HIPIMS) and the arc evaporation belong to the PVD processes most frequently used for the coating of cutting tools.

In the cathodic vacuum arc evaporation (Arc-PVD), an arc arises between the chamber and the target, melting the target material and evaporating the same. Thereby, a large portion of the vaporized material is ionized and subsequently accelerated towards the substrate, having a negative potential (bias potential), and is deposited on the substrate surface. Depending on the used targets and the desired coating chemistry, non-reactive or reactive Arc-PVD processes are used. In the reactive Arc-PVD process a reaction gas is introduced into the PVD reactor, which then reacts with the material evaporated from the target.

Major advantages of the cathodic vacuum arc evaporation process are a high coating rate, dense layer structures due to the high degree of ionization of the vaporized material, as well as a good process stability. On the other hand, a significant disadvantage of the Arc-PVD is the process-dependent deposition of macroparticles (droplets) caused by the emission of small metal splashes, the avoidance of which is extremely complex. These droplets lead to an undesirably high surface roughness of the deposited layers.

When preparing a coated cutting tool for metal cutting, the major goals are a long service life of the tool and high cutting speeds, while providing the tool with the mechanical properties desired for the respective machining operation of the workpiece material.

WO 2014/019897 A1 describes a PVD-coated cutting tool with a wear resistant coating comprising a $Ti_xAl_yN$ coating layer having a multi-layer sub-structure of a plurality of periodically alternating $Ti_{x(A)}Al_{y(A)}N$ layers (A) with $x(A)+y(A)=1$ and $Ti_x(B)Al_y(B)N$ layers (B) with $x(B)+y(B)=1$, wherein the Al concentration y(B) in layers (B) is higher than the Al concentration y(A) in layers (A). The $Ti_xAl_yN$ coating with multi-layer sub-structure is described to exhibit a higher hardness and Young's modulus compared to conventional TiAlN coatings.

WO 2006/041367 A1 describes a PVD-coated cutting tool consisting of a cemented carbide substrate and a coating comprising at least one layer of TiAlN having a thickness of 1.5 to 5 μm and residual compressive stress of a magnitude of >4 to 6 GPa. The TiAlN layer is said to adhere more effectively to the substrate compared to previously known layers.

DE 10 2014 109 942 A1 refers to PVD-coated cutting tools, the coating comprising a $M_{1-x}Al_xN$ refractory layer with x≥68 and M being titanium, chromium or zirconium, wherein the refractory layer includes a crystalline cubic phase having a hardness of at least 25 GPa. The coating is referred to as low stress hard coating and is described to have a residual compressive stress of a magnitude of less than 2.5 GPa.

EP 2 634 285 A1 describes a coated cutting tool comprising a substrate and a multilayered (Ti,Al)N coating. The coating comprises three zones: a first zone (A) closest to the substrate, a second zone (B) adjacent to the first zone and a third outermost zone (C), where zones (B) and (C) each comprises a multilayered aperiodic structure of alternating individual (Ti,Al)N layers X and Y, where individual layer X has a composition with a higher Ti content than individual layer Y. The multilayered structure does not have any repeat period in the sequence of at least 10 consecutive individual layers. The average composition for each zone is different from each other and the thickness of zone C is greater than the thickness of zone B. The residual compressive stress of the entire coating is described to be in the range of between −0.5 GPa and−1.5 GPa, preferably between −0.75 GPa and −1,25 GPa.

US 2014/377023 A1 refers to a coated cutting tool comprising a substrate and a comparatively thick PVD coating applied thereto, wherein one compound layer has a thickness of 10 to 30 μm and the coating has internal stress ranges from low tensile stresses, lower than 0.2 GPa, to compressive stress, lower than 3 GPa, but preferably higher than 0.8 GPa, more preferably higher than 1.3 GPa.

Object of the Invention

It is an object of the present invention to provide a coated cutting tool with improved wear resistance, a good service life, especially wherein the coating exhibits high hardness, a high Young's modulus (modulus of elasticity) and, at the same time, good adherence of the coating to the substrate.

DESCRIPTION OF THE INVENTION

The present invention is directed to a coated cutting tool consisting of a substrate and a hard material coating, the substrate being selected from cemented carbide, cermet, ceramics, cubic boron nitride (cBN), polycrystalline diamond (PCD) or high-speed steel (HSS), wherein the hard material coating comprises a (Ti,Al)N layer stack (L) of alternately stacked (Ti,Al)N sub-layers, the layer stack (L) having the following characteristics:

the overall atomic ratio of Ti:Al within the (Ti,Al)N layer stack (L) is within the range from 0.33:0.67 to 0.67: 0.33;

the total thickness of the (Ti,Al)N layer stack (L) is within the range from 1 µm to 20 µm;

each of the individual (Ti,Al)N sub-layers within the (Ti,Al)N layer stack (L) of alternately stacked (Ti,Al)N sub-layers has a thickness within the range from 0.5 nm to 50 nm;

each of the individual (Ti,Al)N sub-layers within the (Ti,Al)N layer stack (L) of alternately stacked (Ti,Al)N sub-layers being different in respect of the atomic ratio Ti:Al than an immediately adjacent (Ti,Al)N sub-layer;

over the thickness of the (Ti,Al)N layer stack (L) perpendicular to the substrate surface the content of Al increases and the content of Ti decreases from the interface of the (Ti,Al)N layer stack (L) arranged in the direction towards the substrate to the interface of the (Ti,Al)N layer (L) stack arranged in the direction towards the outer surface of the coating;

over the thickness of the (Ti,Al)N layer stack (L) perpendicular to the substrate surface the residual stress σ decreases from the interface of the (Ti,Al)N layer stack (L) arranged in the direction towards the substrate to the interface of the (Ti,Al)N layer stack (L) arranged in the direction towards the outer surface of the coating by an amount of at least 150 MPa to at most 900 MPa, whereby the residual stress σ is measured by X-ray diffraction applying the $\sin^2\Psi$ method based on the (2 0 0) reflection;

the residual stress σ within a portion of a thickness of at least 100 nm to at most 1 µm within the (Ti,Al)N layer stack (L) from the interface of the (Ti,Al)N layer stack (L) arranged in the direction towards the substrate is within the range of from 0 MPa to +450 MPa (tensile stress).

The coated cutting tool of the present invention has improved wear resistance and a good service life compared to the prior art, and the coating exhibits high hardness, a high Young's modulus (modulus of elasticity) and, at the same time, good toughness and good adherence of the coating to the substrate. These properties are advantageous in respect of wear resistance, crack resistance, flaking resistance and tool life.

Further, the coating of the coated cutting tool of the present invention exhibits a comparably smooth surface (low surface roughness), which is advantageous in most metal machining operations in respect of wear resistance, friction forces between the contacting surface of the cutting tool and the workpiece, heat development during machining and coating adhesion to the substrate.

It has been shown by XRD measurements that the (Ti, Al)N layer stack (L) of the present invention shows no or substantially no hexagonal crystal structure, even though the content of Al increases and the content of Ti decreases from the interface of the (Ti,Al)N layer stack (L) arranged in the direction towards the substrate to the interface of the (Ti, Al)N layer stack (L) arranged in the direction towards the outer surface of the coating. A high content of hexagonal (Ti,Al)N crystal structure usually impairs the hardness and the Young's modulus of the coating. Therefore, it is preferred that the (Ti,Al)N layer stack (L) has <5 vol-% hexagonal crystal structure, more preferably <2 vol-% hexagonal crystal structure, measured by XRD.

When herein referring to the residual stress ("a") of a layer or of a substrate, in general, a distinction is made between "tensile residual stress" and "compressive residual stress", both are herein indicated in GPa (gigapascal) or MPa (megapascal), whereby a positive value ("+") means "tensile residual stress", and a negative value ("−") refers to "compressive residual stress". Thus, when comparing residual stress levels, herein, a "higher residual stress" means that the residual stress level is more towards tensile residual stress, i.e. starting from compressive residual stress, a "higher residual stress" either means less compressive residual stress or even tensile residual stress, or starting from tensile residual stress, a "higher residual stress" means even more tensile residual stress. It will be understood that an indication of a "lower residual stress" means the opposite direction of stress level comparison.

The substrate of the coated cutting tool of the present invention is selected from cemented carbide, cermet, ceramics, cubic boron nitride (cBN), polycrystalline diamond (PCD) or high-speed steel (HSS), however, in a preferred embodiment the substrate is made of cemented carbide consisting of WC, Co binder phase, and optionally further cubic hard materials, as it is generally known in this field. Cemented carbides usually exhibit some low tensile residual stress at the substrate surface in the order of about +100 to +300 MPa. If desired, a pre-treatment of the cemented carbide substrate by blasting, shot peening and/or brushing prior to the deposition of the coating may be applied to further reduce the amount of residual stress at the substrate surface and, depending on the pre-treatment method, also in regions below the surface.

According to the present invention the residual stress σ of the (Ti,Al)N layer stack (L) is measured by X-ray diffraction applying the $\sin^2\Psi$ method based on the (2 0 0) reflection. Since XRD always measures over a certain penetration depths into the layer material, it is not possible to measure the residual stress σ of the (Ti,Al)N layer (L) stack only at the very interface to the substrate or to a hard material layer immediately underneath the (Ti,Al)N layer stack (L). Therefore, in the sense of the present invention, the residual stress σ is measured within a portion of a thickness of at least 100 nm to at most 1 µm, preferably at most 750 nm, more preferably to at most 500 nm, most preferably to at most 250 nm, within the (Ti,Al)N layer stack (L) from the interface of the (Ti,Al)N layer stack (L) arranged in the direction towards the substrate. For example, if the final (Ti,Al)N layer stack (L) is intended to have a thickness of 3 to 4 µm, the residual stress σ within the first 100 nm or higher to at most 1 µm from the interface may be measured by depositing the (Ti,Al)N layer stack (L) only to the thickness required for the residual stress σ measurement, e.g. 100 nm to 1 µm, under the same conditions that are then applied for the deposition of the entire (Ti,Al)N layer stack (L). As an alternative, the entire (Ti,Al)N layer stack (L) is first deposited, and then the material is removed to a remaining thickness to be measured. In the latter case of first depositing the entire (Ti,Al)N layer stack (L) and then removing material to reduce the thickness of the (Ti,Al)N layer stack (L), care has to be taken to select and apply a method for the removal of material which does not significantly alter the residual stress within the remaining (Ti,Al)N layer stack (L) material. A suitable method for the removal of deposited coating material may be polishing, however, gentle and slow polishing using a fine-grained polishing agent should be applied. Strong polishing using a coarse grained polishing agent will rather increase the compressive residual stress, as it is known in the art. Other suitable methods for the removal of deposited coating material are ion etching and laser ablation.

In an embodiment of the present invention, the (Ti,Al)N layer stack (L) is deposited immediately to the substrate surface, i.e., the (Ti,Al)N layer stack (L) is in direct contact and has an interface with the substrate surface.

In another embodiment of the present invention, the coating comprises one or more further hard material layers between the substrate and the (Ti,Al)N layer stack (L), i.e., the (Ti,Al)N layer stack (L) is in direct contact and has an interface with the outermost of the one or more further hard material layers.

It has been found that the improved properties of the present invention, including improved adhesion of the inventive coating to the substrate and improved wear resistance, are achieved if the residual stress σ of the (Ti,Al)N layer stack (L) at the interface to the substrate or to a hard material layer immediately underneath the (Ti,Al)N layer stack (L) matches to the residual stress σ at the surface of the substrate or the hard material layer. In this context, "matches" means that the difference between the respective residual stress values (Δσ) is low. According to the invention, the residual stress σ of the (Ti,Al)N layer stack (L) at the interface to the substrate or to a hard material layer immediately underneath is in the range from 0 MPa to +400 MPa, i.e., low tensile residual stress, which matches good to the low tensile residual stress in the order of about 100 to 300 MPa usually found at the surface of cemented carbide substrates.

Accordingly, in a preferred embodiment of the present invention the difference between the absolute amounts of the residual stresses σ of (i) the portion of a thickness of at least 100 nm to at most 1 μm within the (Ti,Al)N layer stack (L) from the interface of the (Ti,Al)N layer stack (L) arranged in the direction towards the substrate and of (ii) the material arranged immediately underneath, which is either the surface of the substrate or a hard material layer arranged between the substrate and the (Ti,Al)N layer stack (L), is 400 MPa, preferably 300 MPa, more preferably 200 MPa, particularly preferably 100 MPa.

In a preferred embodiment of the coated cutting tool of the present invention the alternately stacked TiAlN sub-layers of the (Ti,Al)N layer stack (L) of the coating are deposited by Arc-PVD. More preferably the entire coating is deposited by Arc-PVD.

The deposition of the inventive coating by Arc-PVD provides for a high coating rate, which has advantages for economic reasons in the production process. However, the Arc-PVD deposited inventive coating also exhibits advantageous structural features over other PVD or even CVD deposition methods, such as particularly dense layer structures resulting in the beneficial properties of the coating in metal machining. At the same time, even though the Arc-PVD process generally tends to produce droplets leading to undesirably high surface roughness of the deposited layers, in the Arc-PVD process applied according to the present invention the droplet formation is reduced, and the coatings of the present invention exhibit comparably smooth surface roughness.

In another preferred embodiment of the coated cutting tool of the present invention the difference of the of the atomic ratio Ti:Al of each of the individual (Ti,Al)N sub-layers within the (Ti,Al)N layer stack (L) of alternately stacked (Ti,Al)N sub-layers over the atomic ratio Ti:Al of an immediately adjacent (Ti,Al)N sub-layer is within the range from 0.2 to 1.8 or from 0.3 to 1.5 or from 0.4 to 1.0 or about 0.5.

In another preferred embodiment of the coated cutting tool of the present invention the decrease of the residual stress σ over the thickness of the (Ti,Al)N layer stack (L) perpendicular to the substrate surface from the interface of the (Ti,Al)N layer stack (L) arranged in the direction towards the substrate to the interface of the (Ti,Al)N layer stack (L) arranged in the direction towards the outer surface of the coating is limited to 400 MPa/μm (μm layer thickness), preferably 300 MPa/μm more preferably ≤200 MPa/μm.

In another preferred embodiment of the coated cutting tool of the present invention the atomic ratio Ti:Al of the individual (Ti,Al)N sub-layers having a lower Ti content than an immediately adjacent (Ti,Al)N sub-layer is within the range from 0.2:0.8 to 0.7:0.3, preferably from 0.3:0.7 to 0.6:0.4, and/or the atomic ratio Ti:Al of the individual (Ti,Al)N sub-layers having a higher Ti content than an immediately adjacent (Ti,Al)N sub-layer is within the range from 0.3:0.7 to 0.8:0.2, preferably from 0.4:0.6 to 0.6:0.4, most preferably about 0.5:0.5.

In another preferred embodiment of the coated cutting tool of the present invention the increase of the Al content and the decrease of the Ti content over the thickness of the (Ti,Al)N layer stack (L) perpendicular to the substrate surface occurs step-wise or gradual.

In this context, a gradual increase of the Al content and decrease of the Ti content means that the atomic ratios Ti:Al within pairs of adjacent (Ti,Al)N sub-layers of lower Ti content and higher Ti content decrease essentially continuously over the thickness of the (Ti,Al)N layer stack (L). This includes that the atomic ratios Ti:Al from each pair of adjacent (Ti,Al)N sub-layers to the next pair of adjacent (Ti,Al)N sub-layers decreases. However, this also includes that the atomic ratios Ti:Al over several pairs of adjacent (Ti,Al)N sub-layers remains constant over a certain thickness portion within the (Ti,Al)N layer stack (L). "Essentially continuously" means that the decrease from one atomic ratio Ti:Al to the next occurs by a moderate amount.

A step-wise increase of the Al content and the decrease of the Ti content includes that the atomic ratio Ti:Al over several pairs of adjacent (Ti,Al)N sub-layers remains constant over a certain thickness portion within the (Ti,Al)N layer stack (L), and then the atomic ratio Ti:Al in the next several pairs of adjacent (Ti,Al)N sub-layers is lowered by a significant amount (step). In one embodiment a number of several pairs of adjacent (Ti,Al)N sub-layers with constant atomic ratio Ti:Al form a (Ti,Al)N sub-layer stack.

The increase of the Al content and the decrease of the Ti content within individual (Ti,Al)N sub-layers, either in the (Ti,Al)N sub-layers having the lower Al content, or the ones having the higher Al content, or in both, can be achieved by several ways individually or in combination. For example, an increase of the Al content and the decrease of the Ti content can be achieved by the selection of the types and number of targets containing certain amounts of Al and Ti during the progress of the deposition process. Further, the Al and Ti contents in the deposited coating layers can be varied by varying the deposition condition, such as bias and arc current.

Also, the increase of the Al content and the decrease of the Ti content over the thickness of the (Ti,Al)N layer stack (L) perpendicular to the substrate surface can be achieved by an increase of the thicknesses of the individual (Ti,Al)N sub-layers having higher Al contents than the thicknesses of the individual (Ti,Al)N sub-layers having lower Al contents.

An increase of the Al content and the decrease of the Ti content over the thickness of the (Ti,Al)N layer stack (L) perpendicular to the substrate surface may lead to different residual stresses between parts of the (Ti,Al)N layer stack (L). An increased Al content, i.e., a lower Ti:Al ratio, may give a decreased residual stress σ. Also, the residual stress σ within the (Ti,Al)N layer stack (L) can be influenced by varying the deposition condition, such as bias and arc current. Thus, by varying the Ti:Al ratio over the thickness of the (Ti,Al)N layer stack (L), and/or the deposition conditions during deposition of the (Ti,Al)N layer stack (L), a step-wise or gradual change in residual stress σ can be obtained.

As stated before, a step-wise increase of the Al content and the decrease of the Ti content can be realized by providing (Ti,Al)N sub-layer stacks of several pairs of adjacent (Ti,Al)N sub-layers with each (Ti,Al)N sub-layer stack having an essentially constant atomic ratio Ti:Al.

Therefore, in a preferred embodiment of the coated cutting tool of the present invention the (Ti,Al)N layer stack (L) comprises two or more (Ti,Al)N sub-layer stacks (L1, . . . L2, Lx) arranged immediately on top of each other, wherein within the same (Ti,Al)N sub-layer stack (L1, L2, . . . Lx) there exists a first type of individual (Ti,Al)N sub-layers each of them having the same composition with respect to the Ti:Al atomic ratio and the same thickness, and a second type of individual (Ti,Al)N sub-layers each of them having the same composition with respect to the Ti:Al atomic ratio and the same thickness, wherein the first and second types of individual (Ti,Al)N sub-layers have different Ti:Al atomic ratios. Preferably the number of (Ti,Al)N sub-layer stacks (L1, L2, . . . Lx) is from 2 to 6, more preferably from 2 to 4.

In this embodiment, wherein the (Ti,Al)N layer stack (L) comprises two or more (Ti,Al)N sub-layer stacks (L1, L2, . . . Lx) the overall Al content within each of the (Ti,Al)N sub-layer stacks (L1, L2, . . . Lx) increases from one (Ti,Al)N sub-layer stack to the next (Ti,Al)N sub-layer stack in the direction towards the outer surface of the coating. This increase of the Al content is herein referred to as "step-wise".

In another preferred embodiment of the coated cutting tool of the present invention, wherein the (Ti,Al)N layer stack (L) comprises (Ti,Al)N sub-layer stacks, the (Ti,Al)N layer stack (L) consists of two (Ti,Al)N sub-layer stacks (L1, L2) arranged immediately on top of each other.

In another preferred embodiment of the coated cutting tool of the present invention the average grain size within the (Ti,Al)N layer stack (L) decreases from the interface of the (Ti,Al)N layer stack (L) arranged in the direction towards the substrate to the interface of the (Ti,Al)N layer stack (L) arranged in the direction towards the outer surface of the coating. It has been shown improved wear resistance is achieved when the average grain size within the (Ti,Al)N layer stack (L) decreases, even when comparably thick coatings are applied.

In the embodiment of the invention, wherein the (Ti,Al)N layer stack (L) comprises two or more (Ti,Al)N sub-layer stacks (L1, L2, . . . Lx) the average grain size decreases from one (Ti,Al)N sub-layer stack to the next in the direction towards the outer surface of the coating.

In another preferred embodiment of the coated cutting tool of the present invention the overall residual stress σ of the (Ti,Al)N layer stack (L) in the as-deposited state is <600 MPa, preferably <300 MPa. The overall residual stress σ means the average over the entire thickness of the (Ti,Al)N layer stack.

In another preferred embodiment of the coated cutting tool of the present invention the (Ti,Al)N layer stack (L) has a Vickers hardness HV0.015≥2800, preferably ≥3100, more preferably ≥3300, and/or a reduced Young's modulus >350 GPa, preferably >400 GPa, more preferably >420 GPa.

In another preferred embodiment of the coated cutting tool of the present invention the coating comprises one or more further hard material layers on top of the (Ti,Al)N layer stack (L) and/or between the substrate and the (Ti,Al)N layer stack (L), the one or more further hard material layers containing one or more of the elements selected from Ti, Zr, Hf, V, Nb, Ta, Cr, Mo, W, Al and Si as well as one or more of N, C, O, Ar and B. Preferred further hard material layers include $Al_2O_3$ layers.

Also, further hard material layers can also include additional (Ti,Al)N layer stacks of the type of the invention. For example, the coating may comprise two or more of the inventive (Ti,Al)N layer stacks (L) separated by one or more hard material layers, as defined before, such as $Al_2O_3$ layers.

The present invention further includes the use of the coated cutting tool of the present invention for the milling of steel, preferably for the milling of steel of the groups of work piece materials characterized as ISO-P, ISO-M, ISO-S and/or ISO-K, more preferably ISO-P and/or ISO-M, according to DIN ISO standard 513.

ISO-P steel is the largest material group in the metal cutting area, ranging from unalloyed to high-alloyed material, including steel castings and ferritic and martensitic stainless steels. The machinability is normally good, but differs a lot depending on material hardness, carbon content, etc.

ISO-M stainless steels are materials alloyed with a minimum of 12% chromium; other alloys may include nickel and molybdenum. Different conditions, such as ferritic, martensitic, austenitic and austenitic-ferritic (duplex), create a large family. A commonality among all these types is that the cutting edges are exposed to a great deal of heat, notch wear and built-up edge.

ISO-S heat-resistant super alloys include a great number of high-alloyed iron, nickel, cobalt and titanium based materials. They are sticky, create built-up edge, harden during working (work hardening), and generate heat. They are very similar to the ISO-M area but are much more difficult to cut, and reduce the tool life of the insert edges.

ISO-K cast iron is, contrary to steel, a short-chipping type of material. Grey cast irons (GCI) and malleable cast irons (MCI) are quite easy to machine, while nodular cast irons (NCI), compact cast irons (CGI) and austempered cast irons (ADI) are more difficult. All cast irons contain SiC, which is very abrasive to the cutting edge.

ISO-P and ISO-M steels put high demands on fatigue resistance of the tool, and the coated cutting tools of the present invention have shown to exhibit high fatigue resistance and, at the same time, high hardness, a high Young's modulus, good toughness and good adherence.

Furthermore, the coated cutting tools of the present invention are also suitable for work piece materials requiring high abrasive wear, such as ISO-K materials. Due to the improved adhesion properties of the coatings of the present invention, the coatings can be prepared at high coating thicknesses, which results in improved resistance against abrasive wear.

The present invention further includes a process for manufacturing the coated cutting tool of the present invention comprising the steps of depositing a (Ti,Al)N layer stack (L) of alternately stacked (Ti,Al)N sub-layers by means of Arc-PVD (cathodic arc deposition) using at least two different targets each of them containing the metals Ti and Al, but having different contents of Ti and Al, wherein the applied arc current per target for the deposition of the (Ti,Al)N layer stack (L) of alternately stacked (Ti,Al)N sub-layers is within the range from 50 to 180 A, preferably from 100 to 150 A at a target diameter of 100 mm.

It has been shown that this process enables the production of the tools as described above. In particular, using this process coatings are obtainable having no or a minimum hexagonal structure within the (Ti,Al)N layer stacks, and a particularly low surface roughness is achieved.

In a preferred embodiment the process of the present invention comprises mechanical post-treatment of the coated tool by blasting, shot-peening or brushing, wherein the conditions of the post-treatment are selected to reduce the residual stress of the overall coating by ≥100 MPa, preferably ≥150 MPa. The mechanical post-treatment generally reliefs tensile residual stress and/or introduces compressive residual stress in the coating, sometimes also down into the substrate depending on the mechanical post-treatment conditions (applied energy) and the coating thickness and type.

The preferred mechanical post-treatment method is dry or wet blasting applying a blasting pressure in the range of 1 to 10 bar, a blasting time in the range of 2 to 60 seconds, a blasting angle of 90° relative to the blasted surface, and using a blasting medium selected from $Al_2O_3$, $ZrO_2$ or other hard materials generally used in this technology.

In another embodiment the process of the present invention comprises mechanical pre-treatment of the uncoated substrate prior to the deposition of the coating by blasting, shot-peening or brushing to reduce the residual stress of the substrate surface, wherein the conditions of the pre-treatment are preferably selected to reduce the residual stress of the substrate surface to a value within the range of from −300 MPa to +500 MPa, preferably from −100 MPa to +400 MPa, more preferably from 0 MPa to +300 MPa. The mechanical pre-treatment is useful to reduce the residual stress of the substrate surface to better match with the residual stress of the coating layers applied immediately on the substrate surface. Further, the mechanical pre-treatment is useful to clean the substrate surface prior to the Arc-PVD coating. It may be carried out by the same means as the post-treatment, however, ultrasound or plasma treatment may be applied in addition to or instead of blasting, shot-peening or brushing.

In another embodiment the process of the present invention the Arc-PVD deposition of the (Ti,Al)N layer stack (L) is carried out at a nitrogen pressure in the range from 5 Pa to 15 Pa, preferably from 8 Pa to 12 Pa. If the nitrogen pressure is too low, such as 4 Pa or lower, as it is used in many prior art processes, it has turned out that the roughness of the coating becomes undesirably high due to increased droplet formation, as can be seen from the examples below and FIG. 1.

Further features, embodiments, and advantages of the present invention will become apparent from the following description of examples of the present invention. However, the examples are not intended to limit the invention in any way.

DESCRIPTION OF THE FIGURES

FIG. 1 shows SEM cross sections of two samples deposited at different pressures of 4 Pa and 10 Pa, respectively.

MATERIALS AND METHODS

PVD Coating

For PVD coatings, as described in the examples herein, a Hauzer HTC1000 (IHI Hauzer Techno Coating B.V., The Netherlands) with a chamber size of 1 m³ was used applying a circular Arc-PVD technology (CARC+) using constant magnetic field configuration during deposition.

XRD (X-Ray Diffraction)

XRD measurements were done on a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample is avoided. On the secondary side a Soller slit with a divergence of 0.4° and a 25 μm thick Ni $K_\beta$ filter were used. The measurements were carried out over the range of 15 to 80° 2-theta with a step size of 0.03°. Grazing-incidence X-ray diffraction technique under 1° incidence angel was employed to study the crystal structure of the layers.

Residual Stress

The residual stresses were measured by XRD using the $sin^2\Psi$ method (c.f. M. E. Fitzpatrick, A. T. Fry, P. Holdway, F. A. Kandil, J. Shackleton and L. Suominen—A Measurement Good Practice Guide No. 52; "Determination of Residual Stresses by X-ray Diffraction—Issue 2", 2005).

The side-inclination method (Ψ-geometry) has been used with eight Ψ-angles, equidistant within a selected $sin^2\Psi$ range. An equidistant distribution of Φ-angles within a Φ-sector of 90° is preferred. The measurement was performed on a flank side of the tool, i.e. using an as flat surface as possible. For the calculations of the residual stress values, the Poisson's ratio=0.20 and the Young's modulus E=450 GPa have been applied. The data were evaluated using commercially available software (RayfleX Version 2.503) locating the (2 0 0) reflection by the Pseudo-Voigt-Fit function.

Hardness/Young's Modulus

The measurements of the hardness and the Young's modulus (reduced Young's modulus) were performed by the nanoindentation method on a Fischerscope® HM500 Picodentor (Helmut Fischer GmbH, Sindelfingen, Germany) applying the Oliver and Pharr evaluation algorithm, wherein a diamond test body according to Vickers was pressed into the layer and the force-path curve was recorded during the measurement (maximum load: 15 mN; load/unload time: 20 s; creep time: 5 s). From this curve hardness and (reduced) Young's modulus were calculated. It should be noted that the impression depth should not be more than 10% of the coating thickness, otherwise characteristics of the substrate can falsify the measurements.

Scanning Electron Microscopy (SEM)

The morphology of the coatings was studied by scanning electron microscopy (SEM) using a Supra 40 VP(Carl Zeiss Microscopy GmbH, Jena, Germany). Cross sections were characterized with the SE2 (Everhart-Thornley) Detector.

EXAMPLES

Example 1

Deposition of Coatings According to the Invention and Comparative Coatings

In the following examples of the preparation of cutting tools according to the present invention and of comparative examples cemented carbide cutting tool substrate bodies (composition: 12 wt-% Co, 1.6 wt-% (Ta, Nb)C, balance WC; WC grain size: 1.5 μm; geometry: ADMT160608R-F56) were coated in a PVD system as indicated above. The residual stress at the surface of the substrate, measured prior to heating within the deposition chamber, was +200 MPa, i.e., a low tensile residual stress.

Prior to the deposition, the substrate bodies were pre-treated by ultrasonic cleaning in ethanol and plasma cleaning. The PVD reactor was evacuated to $8 \times 10^{-5}$ mbar, and the substrate was pre-treated at 550° C.

For the deposition of the (Ti,Al)N coatings, two types of targets with different atomic ratios of Ti:Al were used to produce alternately stacked (Ti,Al)N sub-layers being different in respect of the atomic ratios Ti:Al: "Ti50Al50" (Ti:Al=50:50) and "Ti33Al67" (Ti:Al=33:67). If reference is herein made to a target of a particular composition, this means that, due to the layout of the used PVD reactor, a line of four targets of the same composition were vertically arranged to allow for a homogeneous deposition throughout the height of the reactor.

The targets had a diameter of 100 mm. The reactive gas for the nitride deposition was $N_2$. Two types of (Ti,Al)N sub-layer stacks, L1 and L2, were produced. To produce the inventive coating, L1 was deposited immediately on the substrate surface, and L2 was deposited immediately on top of L1. However, to investigate the (Ti,Al)N sub-layer stacks L1 and L2 independent from each other, samples wherein only L1 was deposited immediately on the substrate surface and samples wherein only L2 was deposited immediately on the substrate surface were produced. For the deposition of L1, two targets were used: 1×"Ti50Al50"+1×"Ti33Al67". To achieve a lower Ti content and a higher Al content in L2, for the deposition of L2 three targets were used: 1×"Ti50Al50"+2×"Ti33Al67". The depositions were carried out at different arc currents at the targets, 100 A, 150 A or 200 A arc current per target (source), respectively. The further process parameters for the deposition of different layers are given in the following table 1.

TABLE 1

| | Parameter | |
| --- | --- | --- |
| (Ti,Al)N sub-layer stack L1 | Targets | "Ti50Al50" + "Ti33Al67" |
| | Bias | 40 V |
| | Pressure ($N_2$) | 10 Pa |
| | Arc Current/Target | 100 A, 150 A or 200 A |
| | Rotation Speed | 3 rpm |
| | Temperature | 550° C. |
| (Ti,Al)N sub-layer stack L 2 | Targets | "Ti33Al67" + "Ti50Al50" + "Ti33Al67" |
| | Bias | 40 V |
| | Arc Current/Target | 100 A, 150 A or 200 A |
| | Pressure | 10 Pa |
| | Rotation | 3 rpm |
| | Temperature | 550° C. |

Example 2

Residual Stress, Hardness and Young's Modulus

For the (Ti,Al)N sub-layer stacks L1 and L2, deposited according to example 1, residual stress, hardness and Young's modulus were measured, as described above. Since the parameters during the deposition of an individual (Ti, Al)N sub-layer stacks L1 or L2, respectively, were held constant, the residual stress within an individual (Ti,Al)N sub-layer stack was constant, but differing from one individual layer stack to another one due to the different compositions and depending on the applied arc current. As described above, each of the (Ti,Al)N sub-layer stacks L1 and L2, respectively, was deposited immediately on the surface of the substrate. The thicknesses of the layer stacks was about 2-4 μm. The results are shown in the following table 2.

TABLE 2

| Sample | (Ti,Al)N sub-layer stacks [L1, L2] | Arc Current/ target [A] | Pressure ($N_2$) [Pa] | Residual Stress [MPa] | Vickers Hardness [HV] | Young's Modulus [GPa] |
| --- | --- | --- | --- | --- | --- | --- |
| S1 | L1 | 100 | 10 | +286 | 3234 | 472 |
| S2 | L1 | 150 | 10 | +348 | 3407 | 467 |
| S3 | L1 | 200 | 10 | −182 | 3533 | 480 |
| S4 | L2 | 100 | 10 | +76 | 3332 | 512 |
| S5 | L2 | 150 | 10 | −274 | 3221 | 438 |
| S6 | L2 | 200 | 10 | −504 | 3397 | 411 |

The results show that the applied arc current has an influence on the residual stress of the deposited (Ti,Al)N sub-layer stack, which further depends on the composition. Higher arc current produces layer stacks exhibiting less tensile residual stress or more compressive residual stress, respectively. The same tendency applies for higher overall Al contents, as in L2 compared to L1.

The experiments further show that the (Ti,Al)N sub-layer stack L1, which is the one deposited first on the substrate surface, exhibits low tensile residual stress according to the present invention, when deposited at an arc current of 100 A or 150 A (S1 and S2), whereas an arc current of 200 A (S3) results in low compressive stress, which is outside the present invention. The match of (Ti,Al)N sub-layer stacks L1 of samples S1 and S2 to the substrate surface with respect to the residual stress level improves the adhesion of the coating to the substrate and allows for high coating thicknesses without the disadvantage of flaking. This is of special interest for sharp cutting edges (drills, milling tools).

Furthermore, the coatings of the samples of this example were analyzed by XRD, as described above. In the coatings deposited at an arc current of 150 A or 100 A (S1, S2, S4, S5) no hexagonal phase was found. In the coatings deposited at an arc current of 200 A (S3 and S6) small amounts of hexagonal phase were observed in the (Ti,Al)N sub-layer stacks L1 and L2. Further, the deposition rates were lower at lower arc current, 100 A<150 A<200 A.

Example 3

Surface Roughness

To compare the influence of the nitrogen pressure in the deposition process, two (Ti,Al)N sub-layer stacks of the type L2 were deposited at 4 Pa and 10 Pa, respectively, and surface roughness measurements were carried out. The results are shown in the following table 2. SEM cross sections of the samples are shown in FIG. 1. It can clearly be seen that the sample deposited at 4 Pa(FIG. 1A), shows larger droplets than the sample deposited at 10 Pa(FIG. 1B). Accordingly, the sample deposited at 10 Pa exhibits a much smoother surface roughness. It has been observed that, generally, smoother surfaces with less droplets and defects are obtained if higher pressure is applied during the deposition process.

TABLE 3

| Sample | (Ti,Al)N sub-layer stacks [L1, L2] | Arc Current/ Target [A] | Pressure (N$_2$) [Pa] | Surface Roughness Sa [nm] | Surface Roughness Sq [nm] |
|---|---|---|---|---|---|
| S7 | L2 | 150 | 4 | 123 | 181 |
| S8 | L2 | 150 | 10 | 64 | 125 |

Example 4

Cutting Tests

In order to assess the effect of the coating according to the invention, compared to conventional coatings, with respect to cutting properties, multi-layer coated cutting tools were produced and tested in a milling test. The inventive cutting tool in this example is referred to as sample "HC318", whereas comparative cutting tool is herein referred to as sample "HC359". It is to be mentioned that the coating of the comparative cutting tool "HC359" is a commercially very successful conventional multi-layer coating. The difference between the coating of the inventive sample "HC318" and the comparative sample "HC359" is only in the innermost layer immediately on top of the substrate surface, whereby even the innermost layers in both samples were TiAlN layers. All of the remaining layers of the multi-layer coating were the same in both samples.

The cemented carbide substrates were the same as described above in example 1. In each case the multi-layer coating structures consisted of a total of eleven alternatively arranged TiAlN and Al$_2$O$_3$ layers.

In the inventive example, "HC318", the innermost layer deposited immediately on the substrate surface was a 4.3 μm thick (Ti,Al)N coating according to the present invention, consisting of a first 2.3 μm thick (Ti,Al)N sub-layer stack L1 and a second 2.0 μm (Ti,Al)N sub-layer stack L2, prepared as described in example 1 at arc currents of 150A and at 10 Pa for each of L1 and L2.

In the comparative example "HC359" the innermost layer deposited immediately on the substrate surface was a 4.2 μm thick TiAlN layer deposited in a conventional Arc-PVD process, as follows:

Innermost TiAlN Layer of the Comparative Example:

| | Parameter | |
|---|---|---|
| TiAlN layer | Target | "Ti33Al67" |
| | Bias | 40 V |
| | Pressure (N$_2$) | 10 Pa |
| | Arc Current/Target | 150 A |
| | Rotation Speed | 3 rpm |
| | Temperature | 550° C. |

The subsequent coating layers on top of the innermost layer of each of the samples "HC318" and "HC359", respectively, were deposited under the same conditions and with the same thicknesses for each sample, and they consisted of a sequence of four about 0.5-0.6 μm thick Al$_2$O$_3$ layers and four about 0.5-0.6 μm thick TiAlN layers, alternatively deposited on top of each other, starting with the Al$_2$O$_3$ layer immediately on top of the distinguishing innermost layer. The 0.5-0.6 μm thick TiAlN layers were deposited under the same conditions as the innermost TiAlN layer of the comparative example "HC359" (see table above), and the Al$_2$O$_3$ layers were deposited by dual magnetron sputtering at a 20 kW, a total gas pressure of 0.45 Pa, an Ar flow of 500 sccm, an 02 flow of about 125 sccm, at a bias voltage of 125 V, pulsed with 40 kHz and 10 μs off time and 22 A bias current as well as 480 V cathode voltage after hysteresis (at the operating point).

The metal cutting performance of the cutting tool samples "HC318" and "HC359" was tested in a face milling operation using a face milling cutter type F2010.UB.127.Z08.02R681M (according to DIN4000-88) from Walter A G, Tubingen, Germany, on a Heller FH 120-2 machine under the following conditions.

Cutting Conditions:
Tooth Feed $f_z$ [mm/tooth]: 0.2
Feed $v_f$ [mm/min]: 120
Spindle speed 600 rpm
Cutting speed $v_c$ [m/min]: 235
Cutting depth $a_p$ [mm]: 3
Workpiece material: 42CrMo4; tensile strength Rm: 820 N/mm$^2$ The following table 4 shows the results of the cutting tests, wherein $V_B$ is the minimum wear at the flank faces of the tool, $V_{Bmax}$ is the maximum wear, i.e. the deepest crater observed on the flank face of a tool, and $V_R$ is the wear at the cutting edge radius.

TABLE 4

| Sample ID | $V_b$ [mm] | $V_{bmax}$ [mm] | $V_R$ [mm] | Cutting length [mm] |
|---|---|---|---|---|
| "HC318" | 0.03 | 0.10 | 0.12 | 4800 |
| "HC359" | 0.07 | 0.25 | 0.30 | 4800 |

The results clearly show that the incorporation of the inventive layer according to the invention into the coating structure shows a significant reduction of wear, both at the flank face and the cutting edge radius, in comparison to the very similar layer sequence of the comparative sample being distinguished only in respect of the innermost coating layer.

Example 5

Influence of Post Treatment Operations

The sequence of (Ti,Al)N sub-layer stacks L1+L2 was produced as in the inventive example, "HC318" of example 4 and post treated by shot peening. The residual stress at the coating surface, the Vickers hardness and the Young's modulus were measured, as described above, and were compared to the as-deposited coating. The results are shown in table 5 below.

Shot Peening Parameters:

| Blasting pressure | 5.3 bar |
|---|---|
| Blasting Angle | 90° |
| Blasting Distance | 10 cm |
| Blasting Material | ZrO$_2$ balls (diameter 70-120 μm) |
| Blasting time | 10 sec |

TABLE 5

| Sample | Residual Stress [MPa] | Vickers Hardness [HV] | Young's Modulus [GPa] |
|---|---|---|---|
| post treated | −350 | 3334 | 432 |
| as deposited | −150 | 3238 | 414 |

The post treatment process increases the compressive residual stress at the coating surface. Furthermore, a slight increase in hardness and Young's modulus was measured on the post-treated sample.

The invention claimed is:

1. A coated cutting tool consisting of a substrate and a hard material coating, the substrate being selected from cemented carbide, cermet, ceramics, cubic boron nitride, polycrystalline diamond or high-speed steel, wherein the hard material coating comprises:
   a (Ti,Al)N layer stack of alternately stacked (Ti,Al)N sub-layers, the layer stack having the following characteristics:
   wherein an overall atomic ratio of Ti:Al within the (Ti,Al)N layer stack is within the range from 0.33:0.67 to 0.67:0.33;
   a total thickness of the (Ti,Al)N layer stack is within the range from 1 µm to 20 µm;
   each individual (Ti,Al)N sub-layers within the (Ti,Al)N layer stack of alternately stacked (Ti,Al)N sub-layers has a thickness within the range from 0.5 nm to 50 nm;
   each of the individual (Ti,Al)N sub-layers within the (Ti,Al)N layer stack of alternately stacked (Ti,Al)N sub-layers being different in respect of the atomic ratio Ti:Al than an immediately adjacent (Ti,Al)N sub-layer;
   over the thickness of the (Ti,Al)N layer stack perpendicular to the substrate surface the content of Al increases and the content of Ti decreases from an interface of the (Ti,Al)N layer stack arranged in a direction towards the substrate to the interface of the (Ti,Al)N layer stack arranged in a direction towards the outer surface of the coating;
   over the thickness of the (Ti,Al)N layer stack perpendicular to the substrate surface the residual stress decreases from the interface of the (Ti,Al)N layer stack arranged in the direction towards the substrate to the interface of the (Ti,Al)N layer stack arranged in the direction towards the outer surface of the coating by an amount of at least 150 MPa to at most 900 MPa, whereby the residual stress is measured by X-ray diffraction applying the $\sin^2\Psi$ method based on the (2 0 0) reflection; and
   a residual stress within a portion of a thickness of at least 100 nm to at most 1 µm within the (Ti,Al)N layer stack from the interface of the (Ti,Al)N layer stack arranged in the direction towards the substrate is within the range of from 0 MPa to +450 MPa.

2. The coated cutting tool according to claim 1, wherein the alternately stacked TiAlN sub-layers of the (Ti,Al)N layer stack of the coating are deposited by Arc-PVD, the entire coating being deposited by Arc-PVD.

3. The coated cutting tool according to claim 1, wherein the difference of the of the atomic ratio Ti:Al of each of the individual (Ti,Al)N sub-layers within the (Ti,Al)N layer stack of alternately stacked (Ti,Al)N sub-layers over the atomic ratio Ti:Al of an immediately adjacent (Ti,Al)N sub-layer is within the range from 0.2 to 1.8.

4. The coated cutting tool according to claim 1, wherein the atomic ratio Ti:Al of the individual (Ti,Al)N sub-layers having a lower Ti content than an immediately adjacent (Ti,Al)N sub-layer is within the range from 0.2:0.8 to 0.7:0.3, and/or the atomic ratio Ti:Al of the individual (Ti,Al)N sub-layers having a higher Ti content than an immediately adjacent (Ti,Al)N sub-layer is within the range from 0.3:0.7 to 0.8:0.2.

5. The coated cutting tool according to claim 1, wherein the increase of the Al content and the decrease of the Ti content over the thickness of the (Ti,Al)N layer stack perpendicular to the substrate surface occurs step-wise or gradual.

6. The coated cutting tool according to claim 1, wherein the increase of the Al content and the decrease of the Ti content over the thickness of the (Ti,Al)N layer stack perpendicular to the substrate surface is by an increase of the thicknesses of the individual (Ti,Al)N sub-layers having higher Al contents than the thicknesses of the individual (Ti,Al)N sub-layers having lower Al contents.

7. The coated cutting tool according to claim 1, wherein the (Ti,Al)N layer stack includes two or more (Ti,Al)N sub-layer stacks arranged immediately on top of each other, wherein within a same (Ti,Al)N sub-layer stack there exists a first type of individual (Ti,Al)N sub-layers each of the first type having a same composition with respect to the Ti:Al atomic ratio and a same thickness, and a second type of individual (Ti,Al)N sub-layers each of the second type having a same composition with respect to the Ti:Al atomic ratio and a same thickness, wherein the first and second types of individual (Ti,Al)N sub-layers have different Ti:Al atomic ratios.

8. The coated cutting tool according to claim 7, wherein the (Ti,Al)N layer stack consists of two (Ti,Al)N sub-layer stacks arranged immediately on top of each other.

9. The coated cutting tool according to claim 1, wherein a difference between the absolute amounts of the residual stresses σ of the portion of a thickness of at least 100 nm to at most 1 µm within the (Ti,Al)N layer stack from the interface of the (Ti,Al)N layer stack arranged in the direction towards the substrate towards the interface of the (Ti,Al)N layer stack arranged in the direction towards the outer surface and of the material arranged immediately underneath, which is either the surface of the substrate or a hard material layer arranged between the substrate and the (Ti,Al)N layer stack, is ≤400 MPa.

10. The coated cutting tool according to claim 1, wherein an average grain size within the (Ti,Al)N layer stack decreases from the interface of the (Ti,Al)N layer stack arranged in the direction towards the substrate to the interface of the (Ti,Al)N layer stack arranged in the direction towards the outer surface of the coating.

11. The coated cutting tool according to claim 1, wherein the (Ti,Al)N layer stack has <5 vol-% hexagonal crystal structure, measured by XRD.

12. The coated cutting tool according to claim 1, wherein the overall residual stress σ of the (Ti,Al)N layer stack in the as-deposited state is <600 MPa.

13. The coated cutting tool according to claim 1, wherein the (Ti,Al)N layer stack has a Vickers hardness HV0.015≥2800, and/or a reduced Young's modulus >350 GPa.

14. The coated cutting tool according to claim 1, further comprising one or more further hard material layers on top of the (Ti,Al)N layer stack and/or between the substrate and the (Ti,Al)N layer stack, the one or more further hard material layers containing one or more of the elements selected from Ti, Zr, Hf, V, Nb, Ta, Cr, Mo, W, Al and Si as well as one or more of N, C, 0, and B.

15. A of the coated cutting tool according to claim 1 arranged for the milling of steel.

16. A process for manufacturing the coated cutting tool of claim 1 comprising the steps of depositing a (Ti,Al)N layer stack of alternately stacked (Ti,Al)N sub-layers by means of Arc-PVD (cathodic arc deposition) using at least two different targets, each containing the metals Ti and Al, but having different contents of Ti and Al, wherein the applied arc current per target for the deposition of the (Ti,Al)N layer stack of alternately stacked (Ti,Al)N sub-layers is within the range from 50 to 180 A.

17. The process of claim 16, wherein the Arc-PVD deposition of the (Ti,Al)N layer stack is carried out at a nitrogen pressure in the range from 5 Pa to 15 Pa.

\* \* \* \* \*